US006751111B2

(12) United States Patent
Foss et al.

(10) Patent No.: US 6,751,111 B2
(45) Date of Patent: Jun. 15, 2004

(54) HIGH DENSITY MEMORY CELL

(75) Inventors: Richard C. Foss, Kirkaldy Fife (GB); Cormac O'Connell, Kanata (CA)

(73) Assignee: Mosaid Technologies Incorporated, Kanata (CA)

( * ) Notice: Subject to any disclaimer, the term of this patent is extended or adjusted under 35 U.S.C. 154(b) by 0 days.

(21) Appl. No.: 10/227,380

(22) Filed: Aug. 26, 2002

(65) Prior Publication Data

US 2003/0035331 A1 Feb. 20, 2003

Related U.S. Application Data

(63) Continuation of application No. PCT/CA01/00273, filed on Mar. 5, 2001.

(30) Foreign Application Priority Data

Mar. 5, 2000 (CA) .............................................. 2299991

(51) Int. Cl.⁷ .............................................. G11C 15/00
(52) U.S. Cl. ......................... 365/49; 365/154; 365/156
(58) Field of Search .......................... 365/49, 154, 156

(56) References Cited

U.S. PATENT DOCUMENTS

| | | | | |
|---|---|---|---|---|
| 3,701,980 | A | | 10/1972 | Mundy ........................ 365/188 |
| 4,791,606 | A | | 12/1988 | Threewitt et al. ............. 365/49 |
| 4,799,192 | A | | 1/1989 | Wade et al. ................... 365/49 |
| 4,831,585 | A | | 5/1989 | Wade et al. ................... 365/49 |
| 5,226,005 | A | * | 7/1993 | Lee et al. ..................... 365/49 |
| 5,258,946 | A | * | 11/1993 | Graf ............................. 365/49 |
| 5,383,146 | A | | 1/1995 | Threewitt .................... 365/49 |
| 5,694,355 | A | | 12/1997 | Skjaveland et al. ......... 365/149 |
| 5,973,985 | A | | 10/1999 | Ferrant .................. 365/230.05 |
| 6,005,790 | A | | 12/1999 | Chan et al. ................... 365/49 |
| 6,061,277 | A | | 5/2000 | Lines .................... 365/189.11 |
| 6,157,558 | A | * | 12/2000 | Wong .......................... 365/49 |
| 6,212,094 | B1 | * | 4/2001 | Rimondi ..................... 365/154 |
| 6,291,276 | B1 | * | 9/2001 | Gonzalez ..................... 438/161 |
| 6,320,777 | B1 | | 11/2001 | Lines et al. ................... 365/49 |
| 6,400,593 | B1 | * | 6/2002 | Lien et al. .................... 365/49 |
| 6,442,060 | B1 | * | 8/2002 | Leung et al. ............... 365/154 |
| 6,522,562 | B2 | * | 2/2003 | Foss ............................. 365/49 |
| 6,535,453 | B2 | * | 3/2003 | Nii et al. .................... 365/154 |

FOREIGN PATENT DOCUMENTS

| | | |
|---|---|---|
| JP | 05062474 | 3/1993 |
| JP | 08235867 | 9/1996 |
| JP | 11260063 | 9/1999 |

OTHER PUBLICATIONS

Koichi Takeda, et al., *A 16Mb 400MHz Loadless CMOS Four–Transistor SRAM Macro*, ISSCC, 2000.
Kenneth Schultz,, *Content–Addressable Memory Core Cells—A Survey*, Integration, The VLSI Journal, 23 (1997) pp. 171 to 188.
Noda K et al: "1.9–MUM2 Loadless CMOS Four–Transistor SRAM Cell in a 0.18–MUM Logic Tenchology", San Francisco, CA, Dec. 6–9, 1998, New York, NY: IEEE, US, Dec. 6, 1998 pp. 643–646, XP000859455, ISBN: 0–7803–4775–7.

* cited by examiner

*Primary Examiner*—Trong Phan

(57) ABSTRACT

A memory cell comprising an inverting stage, an access transistor coupled between a data line and an input of the inverting stage, the access transistor being responsive to a control signal for selectively coupling the data line and the inverting stage input, a feedback transistor coupled to the inverting stage input and being responsive to an output of the inverting stage for latching the inerting stage in a first logic state and whereby the cell is maintained in a second logic state by a leakage current flowing through the access transistor which is greater than a current flowing through the feedback transistor.

14 Claims, 14 Drawing Sheets

HIGH DENSITY MEMORY CELL

CROSS REFERENCE TO RELATED APPLICATIONS

This application is a continuation application of PCT/CA01/00273 filed Mar. 5, 2001, which claims priority from Canadian Application No. 2,999,991, filed Mar. 3, 2000.

This invention relates to memory devices and more particularly, to a memory cell for embedded memory applications. One particular application discussed herein is constructing content addressable memories (CAM's) for use in embedded memory systems.

BACKGROUND OF THE INVENTION

Semiconductor memory has continued to increase in density as a result of a number of technological advances in reducing transistor minimum feature sizes and increased flexibility in semiconductor device manufacturing, capabilities. Both static random access memories (SRAMs) as well as dynamic random access memories (DRAMs) have benefited from advances in commodity as well as embedded implementations. Embedded memory applications typically involve combining memory and other logic functions onto a single semiconductor device resulting, in very high bandwidth operation between the memory portion and the other circuitry. Common applications for embedded memory systems include microprocessor cache memory, microcontroller memory, and various system-on-a-chip applications.

In the networking industry, memory plays an important role in increasing the performance of networking systems in general, and specifically for example in the area of Layer 3 Fast Ethernet and Gigabit switches. One particular role which memory plays in such switches is for fast address look-ups. Typically, this type of operation involves comparing an incoming data packet's address information with an existing database consisting of possible addresses indicating where the incoming packet can be forwarded. This type of operation is very well suited for implementation using Content Addressable Memory (CAM) especially as network protocols change and databases used for storing such information continue to grow.

Historically CAMs have not gained as widespread usage as DRAMs or SRAMs due to the larger cell size required to implement CAM. In application specific circuits (ASICs) however, CAMs have been often used to implement application specific memories for such applications as table look-up and associative computing.

For networking applications, CAM is best suited in applications that require the implementation of high performance wide word search algorithms. In such cases, CAM-based searches provide an advantage over other search algorithms implementations, such as software-implemented binary tree based searches for example. This is due to CAM's capability of performing searches using very wide words and searching multiple locations in parallel. Typically, data in a CAM is accessed based on contents of its cells rather than on physical locations. A CAM operates by comparing information to be searched, referred to as search data, against the contents of the CAM. When (and if) a match is found, the match address is returned as the output.

A general background discussion about the various types of CAM cells and their operation is given in the article, "Content-addressable memory core cells—A survey." by Kenneth Schultz in INTEGRATION, the VLSI journal 23 (1997) pg. 171–188. As discussed in the article, CAM cells can be implemented with both SRAM and DRAM type memory cells. There are clearly advantages and disadvantages to using both types of memories to build CAMs. Generally, DRAM based CAMs have a higher density capacity due to the reduced number of elements required to build a cell as compared with SRAM based CAMs but suffer from the additional complication of requiring, periodic refresh in order to maintain the stored data. Various DRAM based CAM cells have been proposed such as in U.S. Pat. No. 3,701,980 to Mundy, and U.S. Pat. Nos. 4,831,585; 4,799,192 to Wade and Sodini and more recently to Lines et al. in U.S. application Ser. No. 09/533,128 assigned to MOSAID Technologies.

For example, a CMOS six transistor (6T) SRAM Cell has been widely used for many years, as shown schematically in FIG. 1. It is a simple robust arrangement and, depending on the ratio of the access transistors Ta and the inverter devices Tn and their complementary loads Tp, may be read either non-destructively or destructively, in which latter case, the data stored must be sensed and written back into the cell. Even the destructive read is a far simpler operation than the corresponding operation of a classic 1T cell DRAM. The drawback of this cell is that it requires a relatively large area for the six transistors and, now increasingly important in modern processes, their contacts and internal cross-coupled interconnections. The need for both complementary bit and $\overline{\text{bit}}$ lines to each cell is a further constraint on packing density as is the need to supply voltages Vdd and Vss to each cell.

Also known for many years is the asymmetric 5T cell, as shown schematically in FIG. 2. This is a small improvement over the 6T cell of FIG. 1 but the added difficulty in ensuring reliable writing and the slower sensing on the single unbalanced bit line means that it is much less used.

Finally there are a number of versions of 4T cells. A common arrangement uses very high value resistors replacing the cross-coupled PMOS loads, as shown schematically in FIG. 3. These simply have to overcome the leakage of the cell storage nodes. The logic high level is also restored from the bit line each time the cell is accessed and the cell can thus operate in a dynamic mode.

Several attempts have also been made to make the access transistors serve much the same function as the resistive loads, feeding charge from the bit lines to maintain a "one" level. In the mid 1970's, Intel described a "Planar Refresh" 1K DRAM using cells with four transistors with the word lines periodically pulsed to refresh all cells simultaneously. More recently, a four-transistor (4T) approach was presented by NEC, "A 16 Mb 400 MHz Loadless CMOS Four-Transistor SRAM Macro," ISSCC, February, 2001 which used p-channel access transistors with higher leakage than their n-channel cross-coupled devices.

The above circuits have some disadvantages in that for many memory applications, there is an increased demand for single chip solutions or so called system-on-a-chip solutions, which require the merging of memory and logic functions onto a single semiconductor chip. For DRAM cells, the DRAM fabrication typically requires special processing steps to construct the cell capacitor structures, such as stacked or trench cell capacitors. Conversely, SRAM memory cells can be easily implemented by using standard logic processes or so-called "non-DRAM processes". A disadvantage however of SRAM memory, is that an SRAM cell typically comprised of 6T or 4T plus 2 resistors, takes up substantially more silicon area than a single transistor plus capacitor found in a typical DRAM cell. When used to construct ternary CAM (three logic state) memory cells, these characteristics of DRAM and SRAM cells are amplified due to the additional complexity required to implement the exclusive NOR function required of a typical ternary CAM cell resulting in relatively large CAM memory cells. And although DRAM based CAMs provide a density advantage over SRAM based CAMs, the special fabrication process steps typically required for DRAM based technology limit the current potential of DRAM based CAMs in embedded memory applications.

While processes offering DRAM process steps combined with regular logic capability are becoming more available, there is increasing concern that the complexity and cost justify their use only in a limited number of applications. More importantly, the time delay between the availability in the industry of such processes relative to simpler all-logic processes for a given geometry, further impacts the economic case for embedding DRAM. Thus for a given memory-to-logic ratio on a die, the die will actually be larger in the case of using a merged DRAM/logic 0.25 micron process to implement the memory portion vs. using SRAM on an all-logic 0.18 micron process to implement the memory portion. This is particularly problematic in applications such as CAM with a high logic overhead even in stand-alone form which incur an even greater area penalty when embedded.

As further considerations, portability between different foundry processes is poorer for the merged process and there are CAD tool inadequacies at this time.

Accordingly, primarily although not exclusively for embedded memory applications, it is desirable to provide a memory cell which benefits from DRAM based high density characteristics but can be implemented in a pure logic process, requiring no additional fabrication process steps for constructing capacitive structures. Preferably, this new cell consists of fewer transistors than typical SRAM memory cells and does not require a cell capacitor to store charge. It is further desirable to use this type of high density memory cell to construct embedded cells for CAM's.

SUMMARY OF THE INVENTION

The present invention seeks to provide a memory cell for high density cell applications having a smaller cell size than conventional SRAM cells, and that is capable of static data storage that is, no refresh of data in the cell is required.

An advantage of the present invention is to replace both regular and embedded SRAM and DRAM cells. In particular, the memory cell can be built using a regular logic process with requiring additional process steps associated with complex capacitive structures. In addition, the memory cell is particularly well suited to complex functions requiring independent read and write paths and content-addressable memories (CAMs).

In accordance with this invention, there is provided a memory cell comprising:

(a) an CMOS inverting stage having an input node and an output node;

(b) an access transistor coupled between a bit line and the input node of said inverting stage for selectively coupling said bit line to said inverting stage input node in response to a control signal received along a control line; and (c) a feedback element coupled between said inverting stage output node and a supply line for latching said inverting stage in a first logic state in response a signal at the input node of said inverting stage.

BRIEF DESCRIPTION OF THE DRAWINGS

These and other features of the preferred embodiments of the invention will become more apparent in the following detailed description in which reference is made to the appended drawings wherein.

DESCRIPTION OF THE PREFERRED EMBODIMENTS

Figure 1:
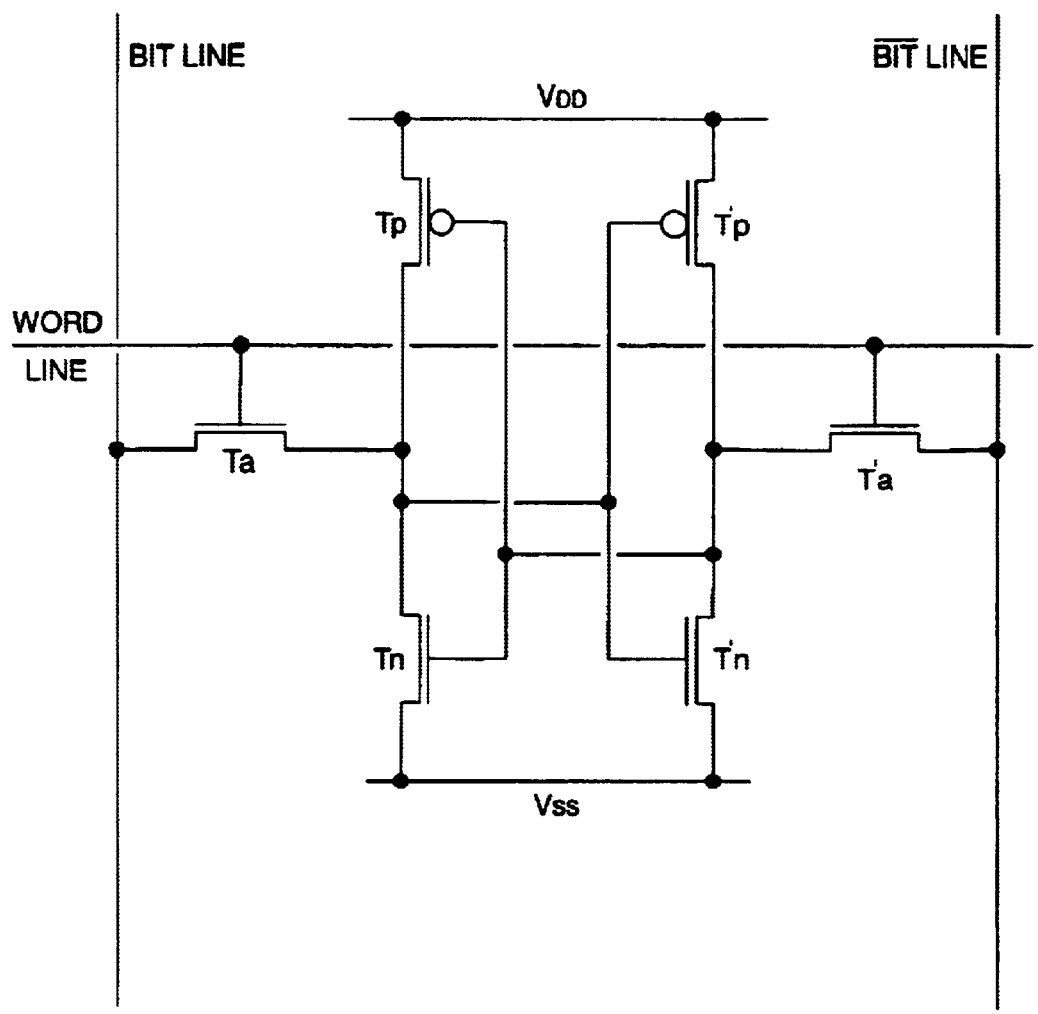
FIG. 1 is a schematic diagram of an 6T SRAM cell, according to the prior art.
Figure 2:
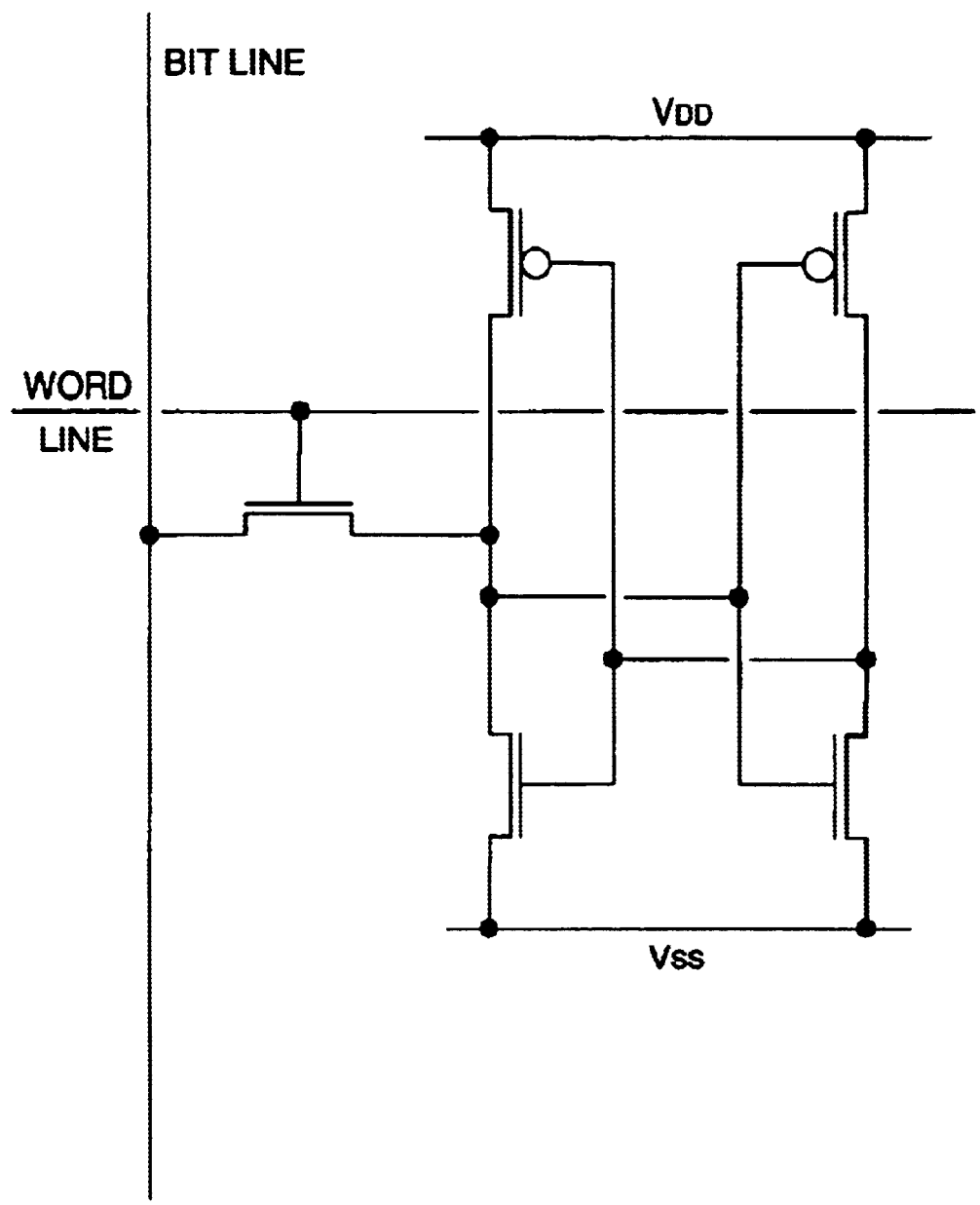
FIG. 2 is a schematic diagram of an 5T SRAM cell, according to the prior art.
Figure 3:
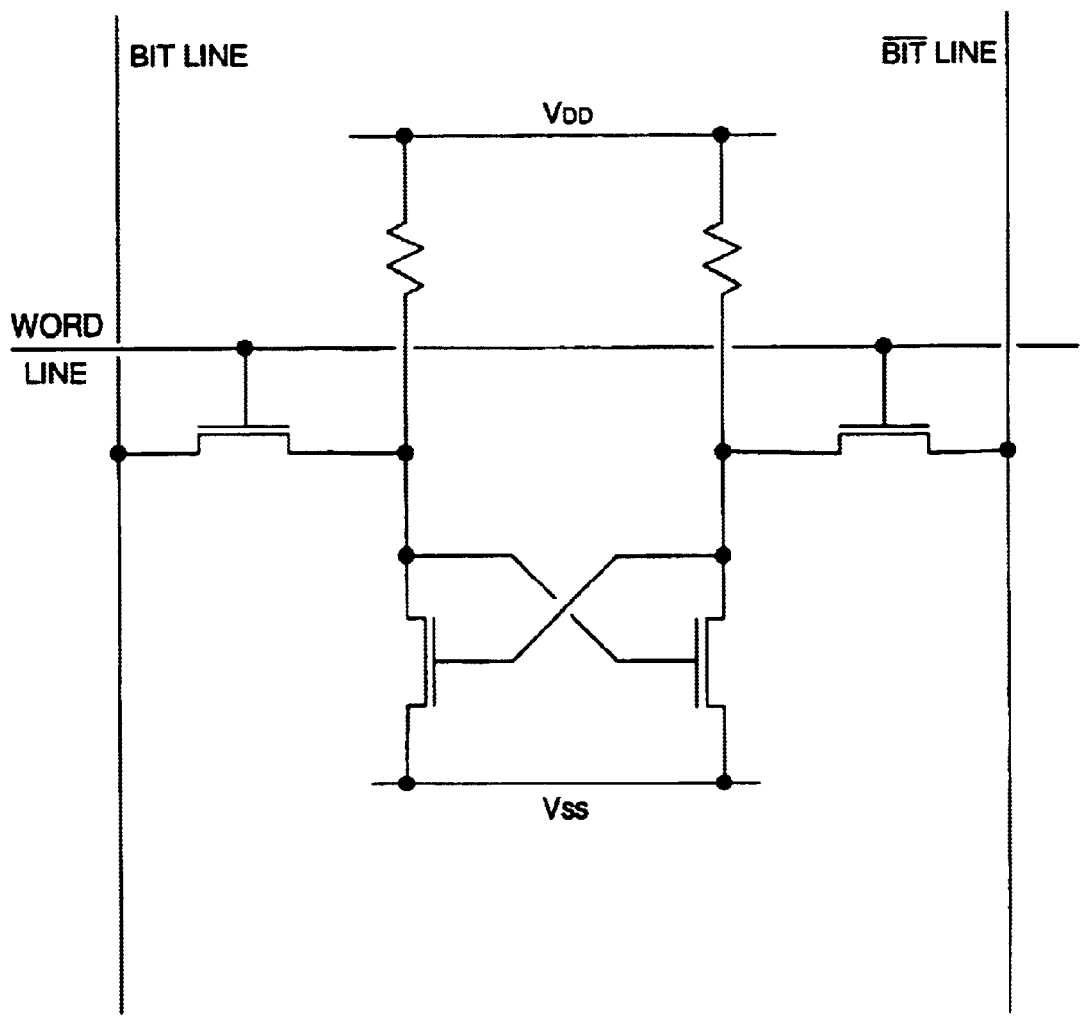
FIG. 3 is a schematic diagram of an 4T SRAM cell with a resistive load, according to the prior art.
Figure 4:
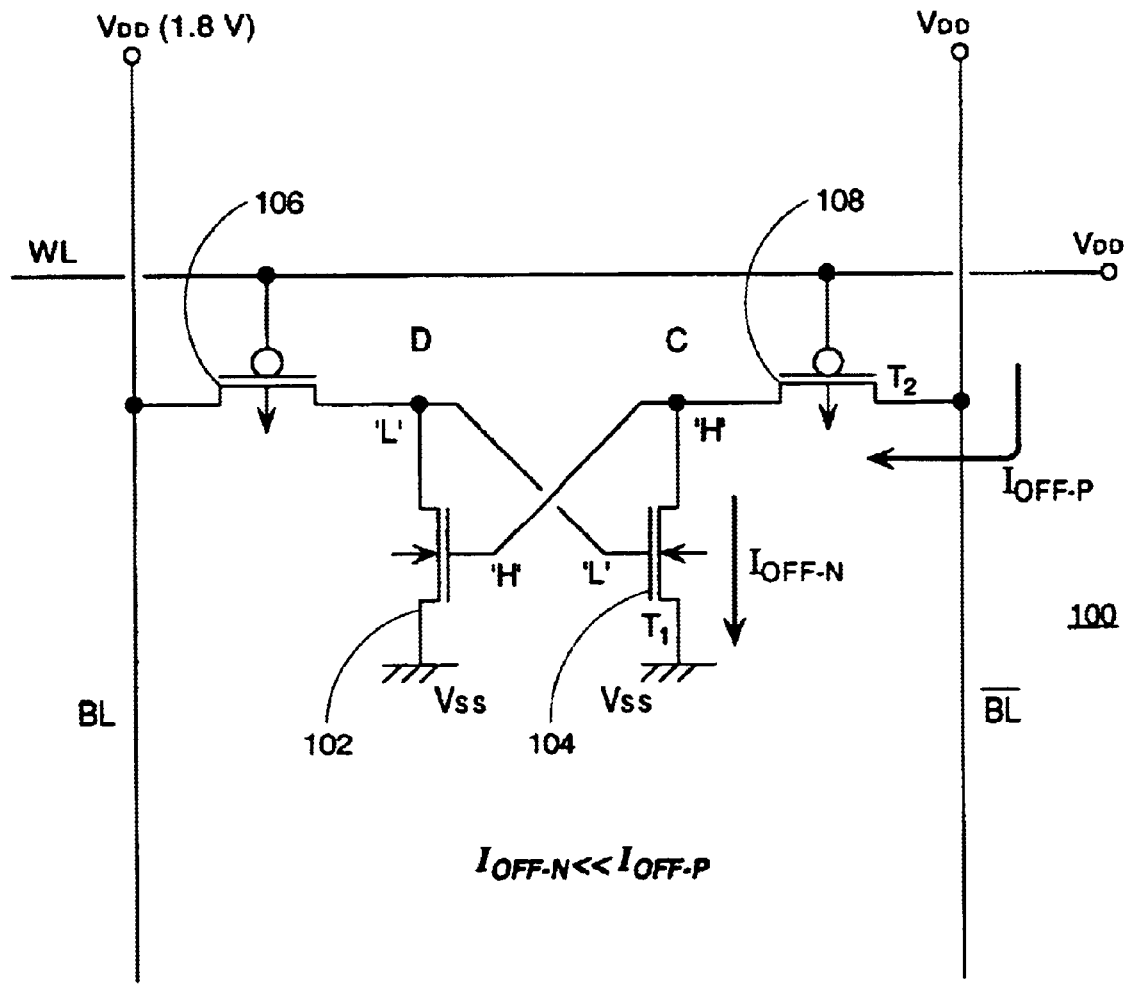
FIG. 4 is a schematic diagram of a "loadless" 4T SRAM cell, according to the prior art.

Referring to FIG. 4, there is shown a loadless CMOS 4T SRAM cell 100 according to the prior art. The SRAM cell 100 comprises a pair of cross-coupled NMOS devices 102 and 104 for drive transistors and a pair of PMOS devices 106 and 108 coupled to respective nodes C and D for access transistors. This configuration resembles a loadless CMOS four-transistor (4T) DRAM cell used in the 1970's except that in this prior art implementation, the cross-coupled devices are NMOS and the access devices are PMOS. The access transistors 106 and 108 are connected to respective bit lines (BL/$\overline{BL}$), with their gates connected to a word line (WL). The circuit arrangement 100 is constructed with the transistors having characteristic such that if the bit lines (BL/$\overline{BL}$) are precharged logic high (VDD) and the manufacturing process and/or the p-channel gate voltage is manipulated to ensure that the PMOS devices have higher leakage current than the NMOS devices, the cell 100 will operate similar to a standard resistance loaded SRAM cell. In other words, in order to retain the data without a refresh cycle, an OFF-state current of the PMOS device $I_{OFF-P}$ has to be higher than that of the NMOS device $I_{OFF-N}$.

The cell 100 uses the PMOS access transistors 106 and 108 as load devices to maintain the data in the cell without the need for a refresh operation. More specifically, in a stand-by case, the bit lines (BL/$\overline{BL}$) are precharged to VDD supply (high) and the word line WL is also precharged to VDD.

Assuming that data in the cell is stored as a logic high ('H') or VDD level at node C and logic low ('L') or VSS level at node D, (the opposite state, i.e. 'H' on node D and 'L' on node C could also be stored, of course) the cell maintains this stored data, i.e. the 'H' at node C by ensuring that the leakage or OFF-state current through the PMOS access transistor 108 is greater than the OFF-state current through the NMOS transistor 104, i.e. $I_{OFF-P} \gg I_{OFF-N}$. This is achieved by increasing the threshold voltage of the NMOS device relative to the threshold voltage of the PMOS device so as to allow more leakage current to flow through the PMOS device 108 than through the NMOS device 104. As a result, the OFF-state current of the NMOS transistor 104 with VDS=1.8V (i.e. the voltage across its drain-source) is lower than the OFF-state current of the PMOS transistor 108 with VDS=0.05V by approximately two orders of magnitude.

There are a number of ways for biasing the "leakage current race" in the circuit of FIG. 4. Simply controlling transistor threshold voltages $V_T$'S by selective gate ion implantation is one. P-channel devices built with N-type polysilicon gates tend to leak due to adverse work function effects creating a buried channel. If the issue is predominantly one of sub-threshold leakage, then adjusting width and/or lengths may accomplish the desired relative difference in threshold voltages. Another solution is to apply a bias voltage to the transistor's tub or substrate (depending, on device polarity) to adjust the threshold voltage. For example, for a circuit having PMOS cross-couples and NMOS access devices and aiming to have NMOS leakage current greater than the PMOS leakage current, by applying a voltage to (or pumping) the n-type tub (i.e. the tub in which the PMOS devices reside) to a voltage higher than VDD, would increase the PMOS devices' threshold voltage. $V_{TP}$, thereby lowering the P-sub-threshold current. This approach would only be effective if leakage from the source or drain of the PMOS transistor to the n-type tub did not excessively increase and thereby eliminate the gain in $V_{TP}$.

Figure 5:
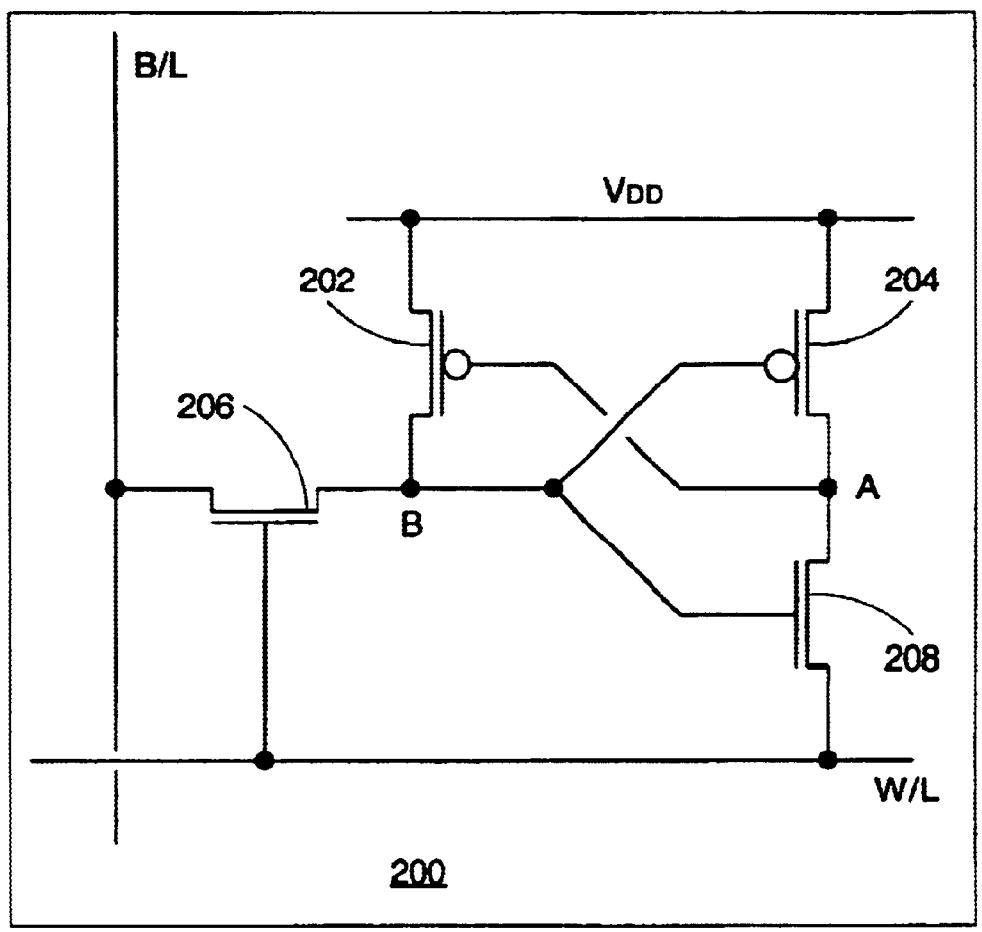
FIG. 5 is a memory cell, according to an embodiment of the present invention.

Referring now to FIG. 5 there is shown generally by numeral 200 an improved memory cell, according to an embodiment of the present invention. The cell 200 is comprised of a pair of crossed-coupled PMOS transistors 202 and 204 each having their respective sources coupled to a VDD supply and transistor 204 having its drain coupled at node A to an NMOS pull-down transistor 208, thereby forming an inverting stage, and transistor 202 having its source coupled at node B to an NMOS access transistor 206 which couples node B to a bit line BL while its gate is coupled to a word line WL. The NMOS transistor 208 has its source coupled to the word line WL while its gate is coupled to node A of the cross-coupled pair.

Thus, it may be seen that the cell 200 of FIG. 5 is an improvement over the cell 100 shown schematically in FIG. 4, in that there is a reduction of one bit line and the ground line VSS. In addition, the cell 200 provides at least one "hard" node A (i.e. a node which maintains the voltage level without significant degradation as long as the WL remains enabled thereby providing a ground for a possible search interrogation in a CAM operation. Just as regular 4T SRAM cell can operate dynamically or statically, if a "keeper" current is supplied by a resistive load or other similar means, the cell 200 may be operated in either dynamic or static mode. Schematically, the cell 200 is shown "upside down" compared to the cell 100 of FIG. 4, in that the transistor types of the cross-coupled and access devices are reversed. However, depending on how the leakages between P and N are controlled, the cell 200 can equally well be implemented with N-channel devices as the cross-coupled transistors 202 and 204 and P-channel transistors as access devices 206 and 208 while the bit line is held normally high. This alternate embodiment will be discussed in further detail with reference to FIGS. 9 and 10.

Referring back to FIG. 5, the cell configuration 200 has its word line (WL) normally held at logic low or ground voltage and is only pulsed high briefly to turn on the access device 206 after which it is returned to the ground voltage level. Therefore, the word line (WL) serves as the ground for the inverting stage of the circuit. This has a drawback of increasing the word line capacitance, but has the advantage of eliminating a metal line running through the CAM cell and simplifying writing to the cell.

The operation of the cell may be explained as follows: in a write operation, the bit line BL is set high or low depending on the logic of the data to be written. The word line WL is then pulsed for a predetermined period. During the time period when the WL is high, data is passed to the "soft" node B (i.e. a node which will experience signal degradation without unless refreshing to the node is provided) via the access device 206. Once WL returns to logic low, data is stored on the "soft" node B and the inverted or "hard" node A.

There are two write operation cases where a change of state of the cell 200 is possible. The first is writing of a logic low into a cell which currently stores a logic high, and the second is the writing of a logic high into a cell which currently stores a logic low. The other two possibilities are the writing of a logic low into a cell which already stores a logic low and a writing of a logic high into a cell which already stores a logic high. These latter two possibilities are also supported but will not be described in detail since no change of state in the cell occurs.

Firstly, consider the case of writing a logic low into a cell, which stores a logic high. Prior to the write operation beginning, the "soft node" B is logic high and the inverted or "hard node" A is logic low. As previously mentioned, the write line WL is kept logic low during "standby". Next, a logic low is loaded onto the bit line BL and the WL begins to rise turning on the access device 206, thereby bringing, node B to a logic low, which in turn, sets node A to logic high through the pull-up PMOS transistor 204 in the inverting stage. The PMOS transistor 202, which is connected to the "soft" node B, is therefore turned off. Once the WL is turned off, the access device 206 turns off so both the access device 206 and the pull-up PMOS transistor 202 are both off. The logic low data on node B is kept in this state through leakage current only. Specifically, the leakage or OFF-state current flowing through the NMOS access device 206 is greater than the OFF-state current flowing through the PMOS pull-up transistor 202 connected to node B. This can be accomplished for example, by setting a threshold voltage of the NMOS transistor 206 to be lower than that of the PMOS transistor 202. This lets the access NMOS device 206 conduct more than the PMOS device 202. Alternately, the threshold voltages of the NMOS and PMOS devices can be altered by applying a higher than VDD voltage to the N-type tub in which the PMOS device lies.

Secondly, consider the case of writing a logic high into a cell that stores a low. In essence a similar process as described above is executed. A logic high is placed on the bitline BL. The word line WL is brought to logic high turning ON the access NMOS device 206. This passes a VDD-VTN level to node B (the threshold voltage drop VTN occurs across the NMOS access device 206). The NMOS control device 208 is now ready to turn ON. The VDD level at the access transistor 206 occurs when the bit line BL is logic high. When the WL is brought to logic low again, the NMOS device 208 turns fully ON and pulls node A to a low logic level. This turns on feedback PMOS device 202 fully thus latching node B high. In this state, no leakage current is needed to keep the data stored on nodes B and A, since the logic low on node A ensures that node B is maintained high.

The following describes the reading operation. For the case of reading a logic high stored on node B (and a logic low on node A), the bit line BL begins precharged low and the word line WL level rises. A pulse of current begins to flow into the bit line as the high stored on node B is read onto the bit line with a threshold voltage drop across access transistor 206 so that the voltage on the bit line eventually reaches VDD–$V_{TN}$. This voltage difference on the bit line can be detected using well known DRAM type sensing, by comparing another half bit-line to which is attached a dummy cell having half the size of a normal cell. Since the data sensed on the bit line BL has to be restored onto node B (the "soft node") in order for the cell to retain the correct data, once the data is sensed and amplified on the bit line this logic high value is written back into node B while the word line remains high. The write back is then completed as the word line falls.

For the case of reading a logic low stored on node B (and a logic high on node A), the bit line begins precharged and the word line rises. Since there is no voltage difference between the bit line which is precharged low and the value stored on node B, no current flows and the value on node B remains unchanged. Once the word line falls, the value on node B is maintained as described earlier by ensuring that the leakage current through the NMOS access device 206 is greater than the leakage current through the PMOS feedback transistor 202, i.e. IOFF–N>>IOFF–P. This can be accomplished as described earlier by applying a voltage lower than VSS to the p-well of the NMOS device 206 (for example, an on-chip generated negative voltage supply VBB). This will effectively lower the threshold voltage of NMOS device 206 relative to the threshold voltage of PMOS device 202 and ensure that a larger leakage current flows through NMOS device 206 than through PMOS device 202, thereby maintaining the logic low value on node B.

It must be remembered that this sense-restore function is only needed during a read operation in a CAM if (a) the cell is operating as a dynamic CAM (DCAM) cell or (b) as a dynamic back-up mode to static mode operation or (c) there is a need to read the cell contents (such as in testings or content read-out operating mode). In general however, for common search and compare operations generally performed by CAMs, the read operation is not needed.

In constructing cell 200 of the present invention, use is made of both P and N devices thus a trench isolated process with tight P+ to N+ spacing would be preferable.

In a further embodiment of the present invention, the cell configuration of the present invention may be utilized to implement a ternary CAM cell. Any ternary CAM cell should be capable of both storing a "don't care" state and searching with a masked bit. Accordingly, the CAM cell must have three states for each, which in practice requires a double binary cell, i.e. the cell must be able to store a logic "0" a logic "1" and a logic "don't care" and must also be able to mask these three values.

Figure 6:
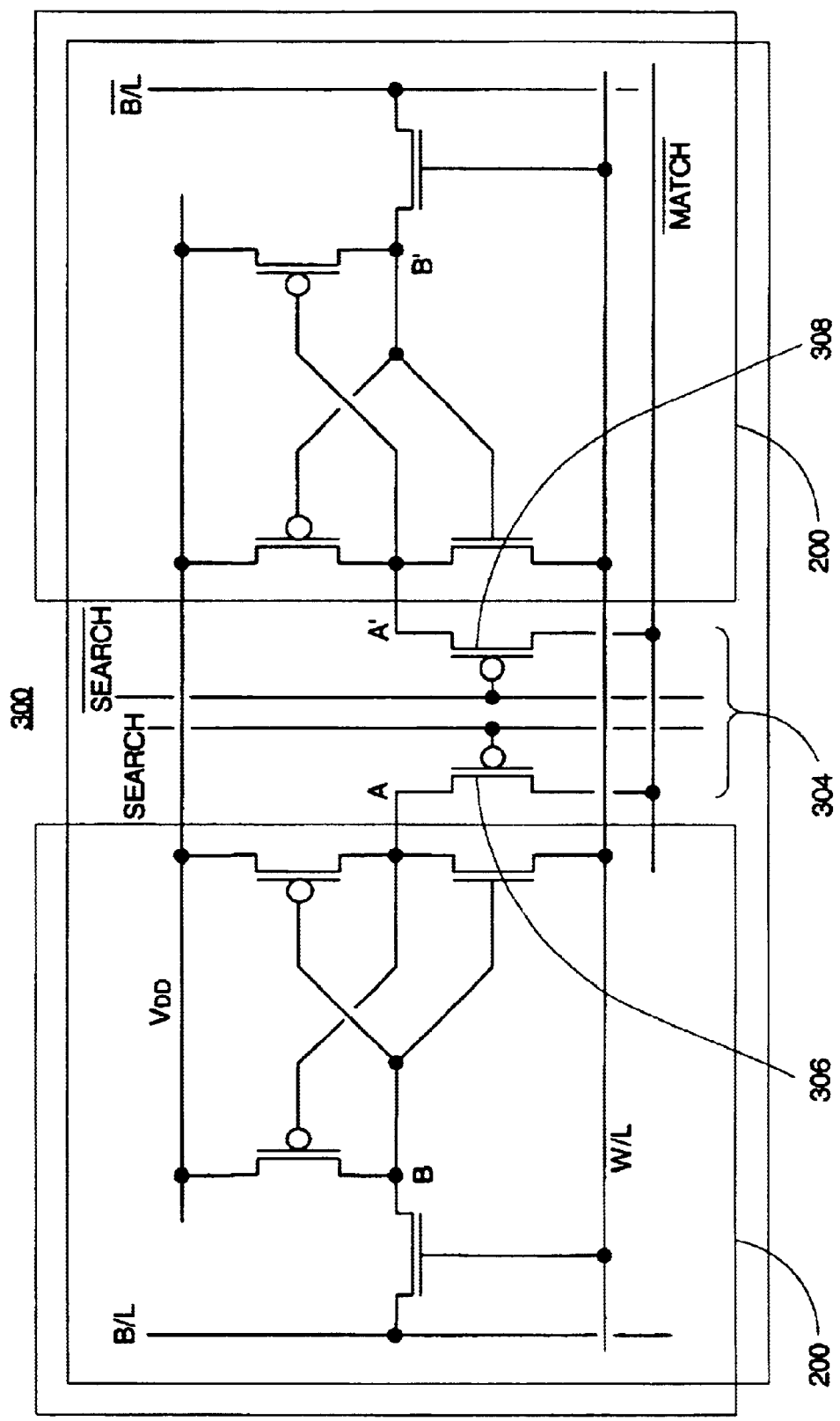
FIG. 6 is a ternary CAM cell, according to a further embodiment of the invention.

Referring to FIG. 6, a 10T ternary CAM cell 300 is shown constructed according to an embodiment of the invention, which comprises a pair of cells memory cells 200 as described with reference to FIG. 5 and additional devices 306 and 308 for implementing an exclusive OR (XOR) function 304 required for search and compare operations.

There are numerous ways of implementing the XOR function given NMOS and/or PMOS devices each implementation having circuit and layout advantages and disadvantages. In FIG. 6, AND gating between the source and the gate of P channel devices 306, 308 is shown. Specifically, PMOS transistors 306 and 308 have their respective source-drain circuits connected between respective "hard" nodes A and A' and a match line $\overline{\text{MATCH}}$. Their respective gates are connected to complementary search lines SEARCH and $\overline{\text{SEARCH}}$ applied to the gates of transistors 306 and 308 respectively. The AND gating operates so that SEARCH and $\overline{\text{SEARCH}}$ compare with the stored data. The $\overline{\text{MATCH}}$ line will only stay low if "hard" node A and SEARCH are both low (and "hard" node A' and $\overline{\text{SEARCH}}$ are high) or if both A and A' are both low or SEARCH and $\overline{\text{SEARCH}}$ are high (or of course, A and A' are low and SEARCH and $\overline{\text{SEARCH}}$ are high). All other combinations result in $\overline{\text{MATCH}}$ being pulled up but only as far as VDD–$V_{TP}$, where $V_{TP}$ is increased by the source-tub bias as it is source-following. This requires a match sensing circuit which will detect the difference between current flowing or not flowing into a level between VSS and VSS+$V_{TP}$.

The search/match transistors 306,308 may be implemented as N channel devices without risk of disturbing the "soft" nodes B and B'. However, the search line now puts current into the word line which is low thus the match detect circuit must respond to current drawn from the voltage of the match line which is between VDD and VDD–$V_{TN}$, where $V_{TN}$ is source-following enhanced. A difficulty with this implementation is that the basic cell may need to have a voltage $V_{TP}$ greater than $V_{TN}$.

Figure 7:
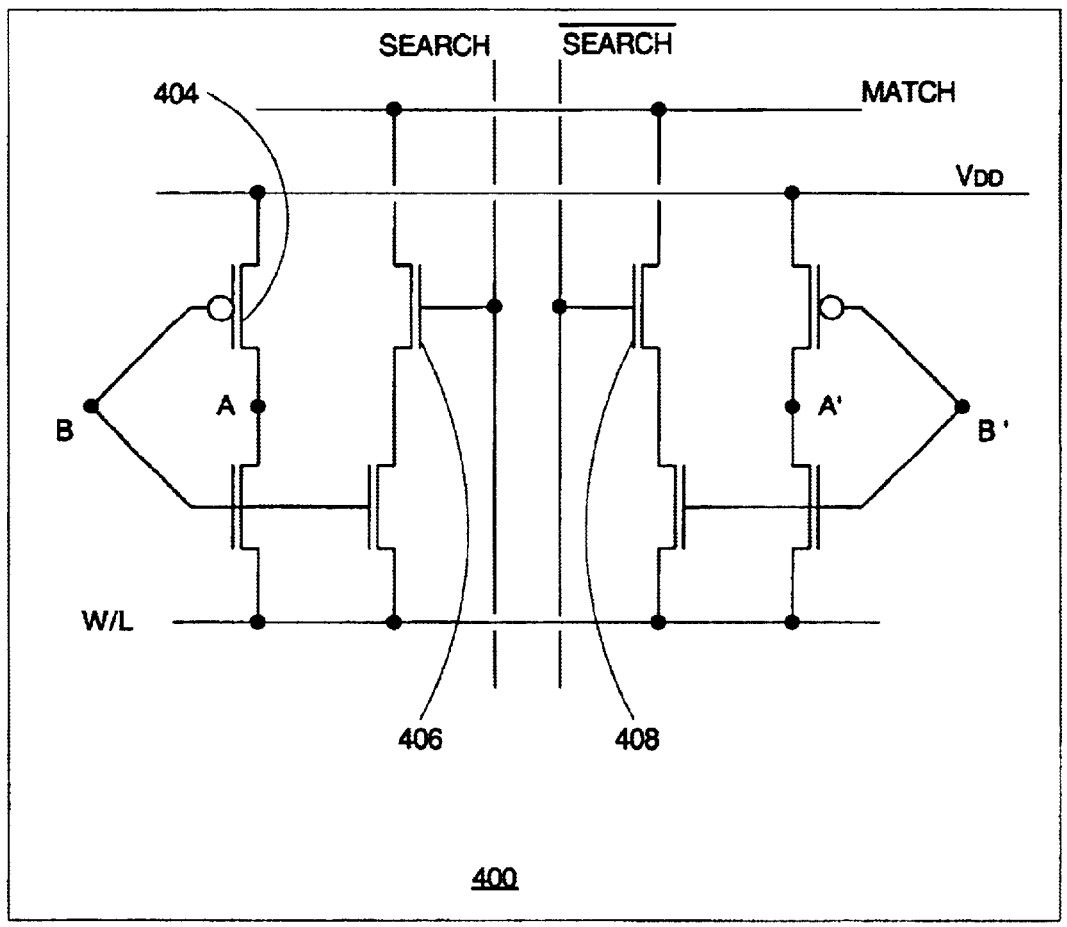
FIG. 7 is a schematic diagram of an n-channel quad configuration, according to an embodiment of the present invention.

Alternatively, a ternary CAM cell with a more conventional 4-transistor XOR circuit may be implemented. This circuit however requires two additional transistors compared to the circuit 300 but in general, these transistors require very little additional area. Referring to FIG. 7, a ternary CAM cell with an N-channel 4-transistor circuit configuration 400 is shown. The two extra devices 407, 409 are connected as common-gate, common-source to the "hard" node pull-down transistors 404, 405 and shared source-drain to the search devices 406, 408. This configuration still allows some leakage current to flow into the low word lines but places no sensing restrictions on the match line MATCH. Replacing all four transistors with p-channels may be the best solution in this polarity. To avoid any coupling to the soft node B, these transistors may be common-gate, common-source with the transistors whose gates are connected to nodes A, A' and B,B' respectively. This would make writing and searching operations nearly independent.

It should be noted that a binary CAM needs only the one 4T-cell stored with a p-channel XOR quad driven by both nodes. Such a cell thus has 8 transistors and 6 lines and is still capable of doing a masked search though not a stored "don't care".

Clearly, there are a number of factors to weigh in choosing the best compromise between circuit simplicity, area, and rugged operation.

Figure 8:
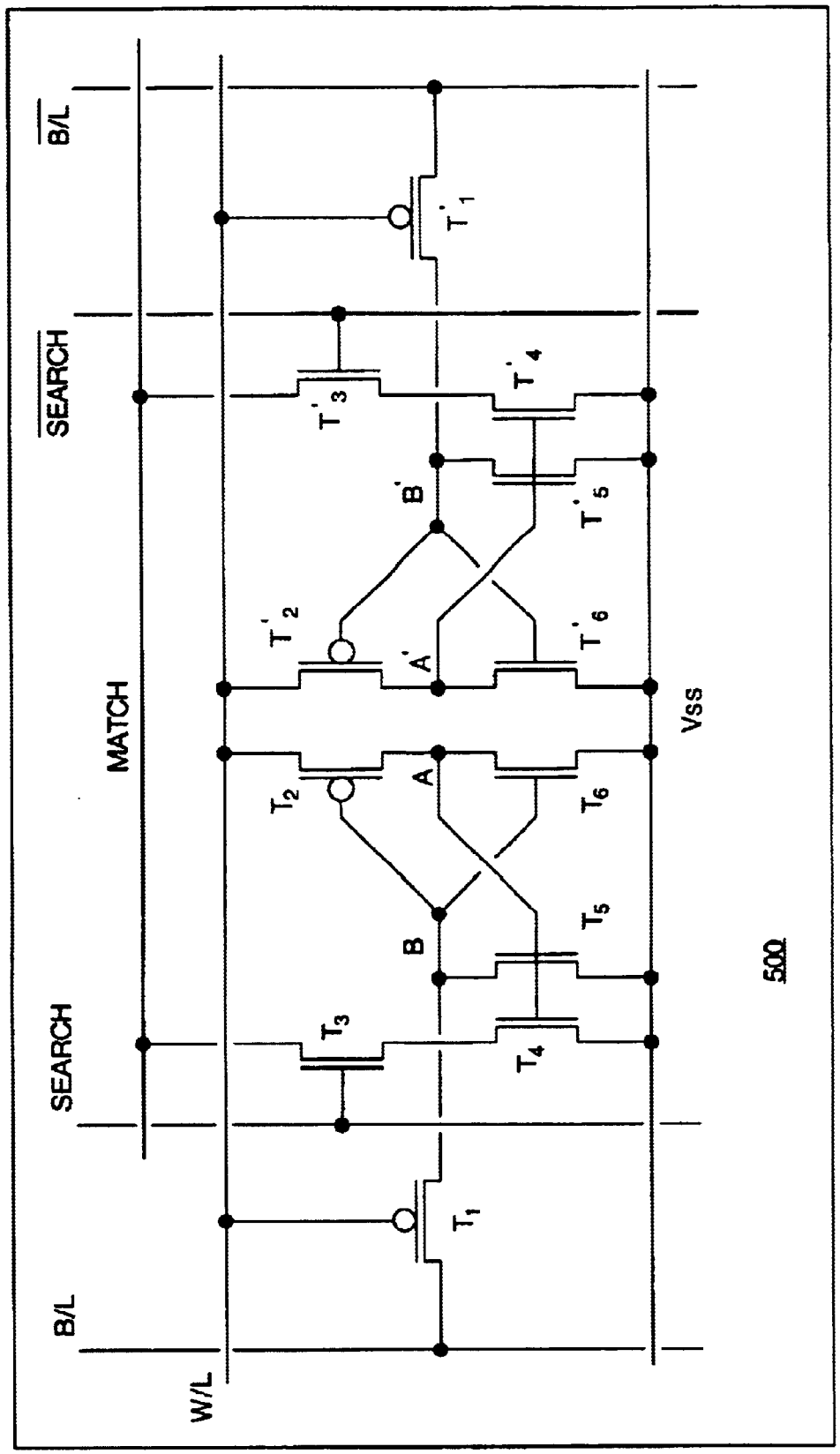
FIG. 8 is a schematic diagram of a ternary CAM cell, according to a another embodiment of the present invention.

Referring to FIG. 8 a complete version of a ternary CAM circuit implementation 500 according to a preferred embodiment of the present invention is shown. The circuit 500 comprises twelve transistors T1, T2, T3, T4, T5, T6, T1', T2', T3', T4', T5' and T6'. The circuit 500 is based on p-channel access transistors T1 and T1', so the presumption is that P-channel leakage is greater than N, or that the cell operates dynamically. The word line WL is normally logic high and a match line MATCH is pulled down by all cells where a mismatch occurs. A logic low stored on "hard" nodes A and A' prevents a pull down as does logic low levels stored on the SEARCH and $\overline{\text{SEARCH}}$ lines. As there are actually four states, other functions are also possible. A logic high on both the "hard" nodes A and A' will inhibit any match being detected regardless of search word unless that search word is masked by logic low on both and lines.

The layout would likely cluster T1, T1' and T2, T2' in a tub containing the corresponding devices of the inverted cell above. T1 and T1' might share a gate contact. T3, T4 and T5 will obviously cluster with the match line likely below VSS. VSS may be a common connection to the inverted row of cells below.

As an additional enhancement to the embodiment of FIG. 8, a way of ensuring that data is maintained despite a read operation involves using a simple form of refresh similar to the planar refresh operation used in the aforementioned Intel 1K DRAM. If a selected cell's word line (which is normally held at VDD in this PMOS access implementation) is periodically dropped to VDD-$V_{TP}$ while its associated bit line is at logic high, this will "top up" a logic high level in the cells storing logic high's on their "soft" nodes B through a current mirror plus sub-threshold action. This "top up" current will be easily overcome by NMOS pull-down transistors when turned on. This will most likely work best with the symmetric version of the 4T SRAM cell as shown in FIG. 4 or with an asymmetric version where the P-channel in the half-flop (T2 or T2'), as in FIG. 8, has its source at VDD rather than WL since lowering the WL will reduce the drive to the N-channel holding down a logic "zero" on the "soft" node. This refresh would be as transparent as the static operation described by with reference to FIG. 4 and multiple word lines could be glitched in this way.

The basic cell configuration 200 of FIG. 5 could be used for embedded SRAM applications such as cache memory in microprocessors/microcontrollers.

In a CAM context, if static, the cell can be a "write-only" cell with search logic connected to it. Alternatively, it can be read destructively, its state sensed and restored back in, which is how it would be operated dynamically.

Figure 9:
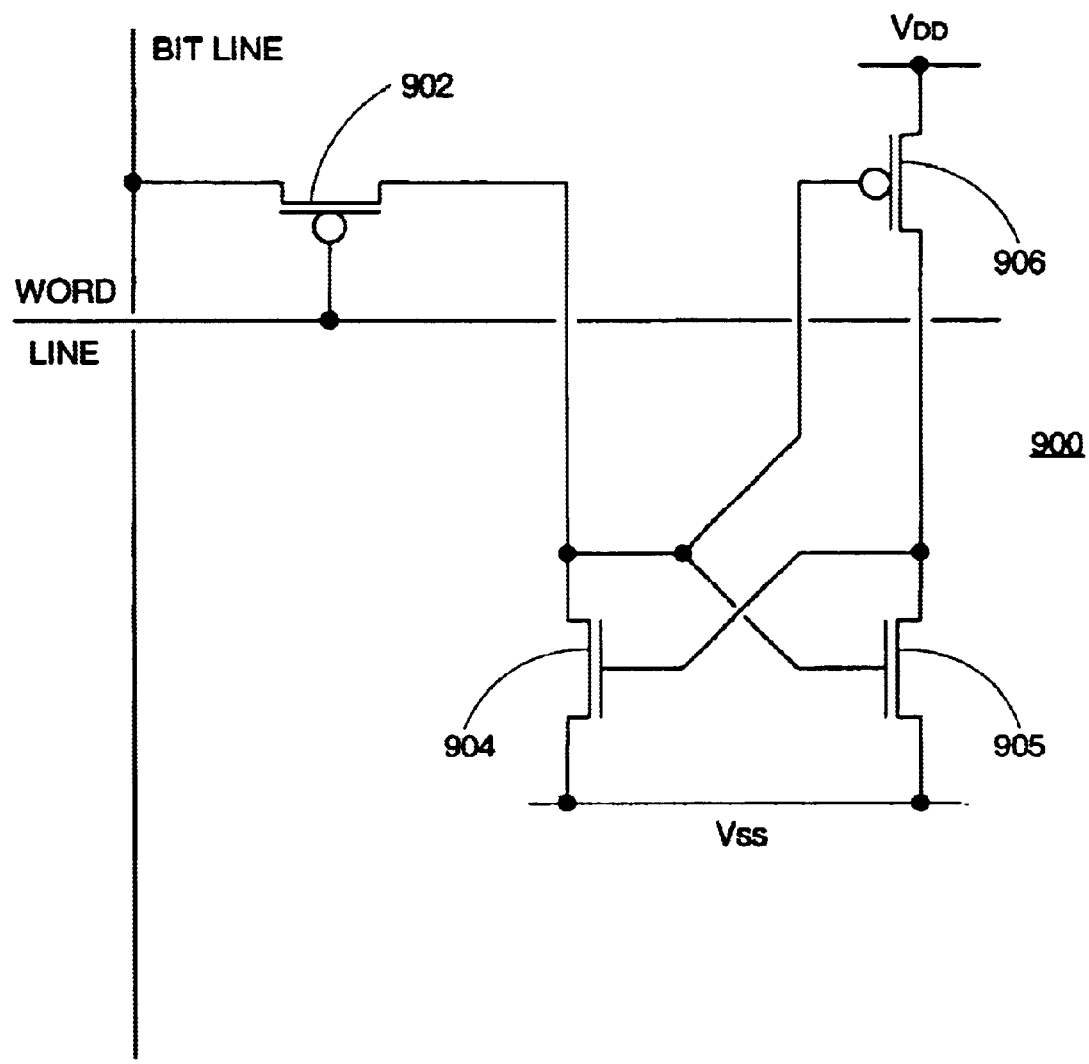
FIG. 9 is a schematic diagram of an asymmetric 4T memory cell according to a further embodiment.

A further embodiment of the invention a basic asymmetric 4T cell 900 is shown in FIG. 9. It combines a regular CMOS inverter formed by a pair of transistors 906 & 905, with a single p-channel access transistor 902 and an n-pull-down to a "soft" node 904. Like the regular 4T cells, this "soft" node will require one of the means noted for regular 4T cells to sustain a logic "one" level. This implies regular refreshing by pulsing low the word line or means to control p-channel leakage to be greater than that pulling down on that node while it stores a logic one. The word line logic high level can be regulated to a level lower than Vdd or a low threshold PMOS device can be used as the access transistor for instance.

Figure 10:
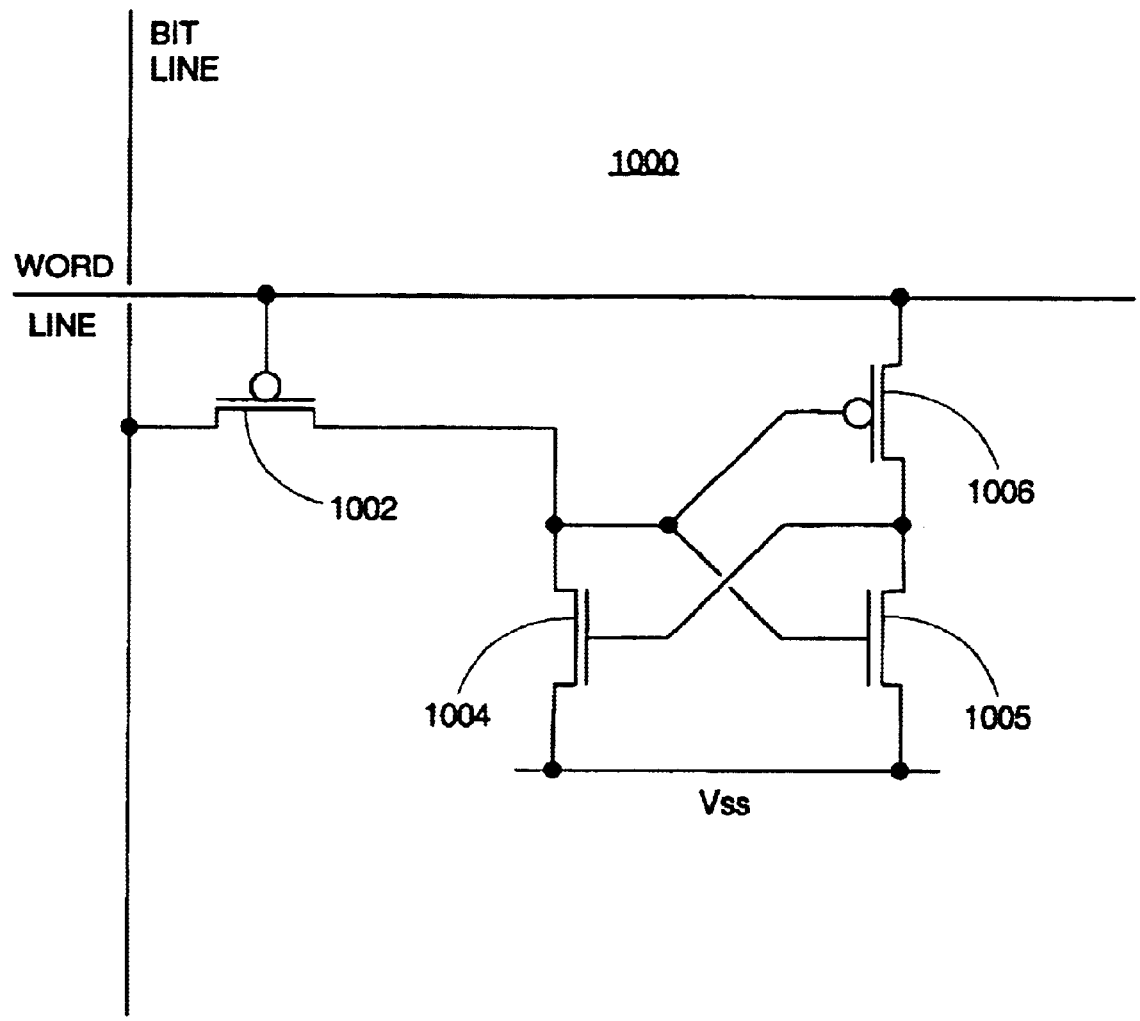
FIG. 10 is a schematic diagram of a memory cell according to another embodiment.

In some applications, the further simplification of the circuit in FIG. 9 may be possible. This is shown in FIG. 10 at numeral 1000. The inverter comprises a p-channel transistor 1006 and an n-channel transistor 1005. The embodiment of FIG. 10 eliminates the need for a Vdd supply by connecting the inverter power supply node to the word line which is maintained normally at logic high except for a small pulse to enable the access transistor 1002. As well as eliminating a metal line running through the memory cell, this approach eases writing of date, as it is not then necessary for the p-channel access transistor 1002 to overcome the n-channel's 1004 role of holding down the "soft" node while it stores a logic zero, as the drive to the n-channel is automatically removed. The cost is a more difficult read. The cell now only extracts a limited amount of charge before the n-channel turns off. The cell thus behaves very much like a 1T cell DRAM working with a bit line pre-charged to logic high with an effective capacitance which may be some 10's of fF. As such, it would need to be sensed and restored. However, in applications such as the CAM use, there is not actually a need to read the cell via the bit line. Instead, the cell controls inputs to an exclusive-OR gate to compare cell contents to search data. Similarly, a separate read BL with a read WL controlling access would give separate read and write ports to the cell. The reduced signal line count is especially useful in such multi-porting applications.

Figure 11:
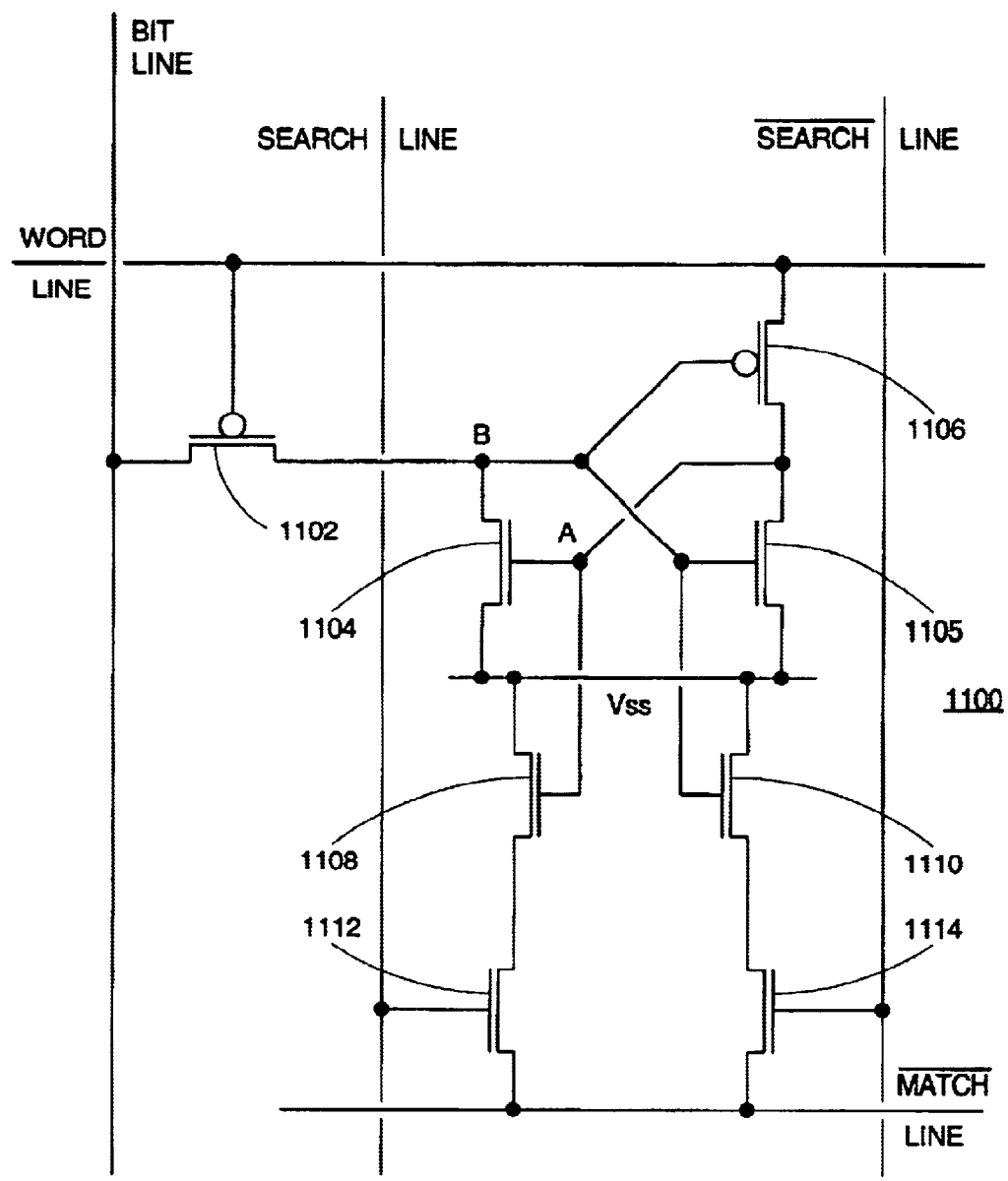
FIG. 11 is a schematic diagram of a binary CAM cell using the cell of FIG. 10.

Referring to FIG. 11, there is shown a Binary CAM cell 1100 wherein both nodes B and A of the memory cell are connected as inputs to the exclusive-NOR gate. The output of the gate goes as a wired-OR to the $\overline{\text{match}}$ line which will have a path to ground if there is any mismatch between stored data and that on the search and $\overline{\text{search}}$ lines. A double logic zero will result in the cell data being ignored but there is no way to store a "Don't Care" state in the memory cell. To store three states requires two bits of storage as is shown in the circuit 1200 of FIG. 12.

Figure 12:
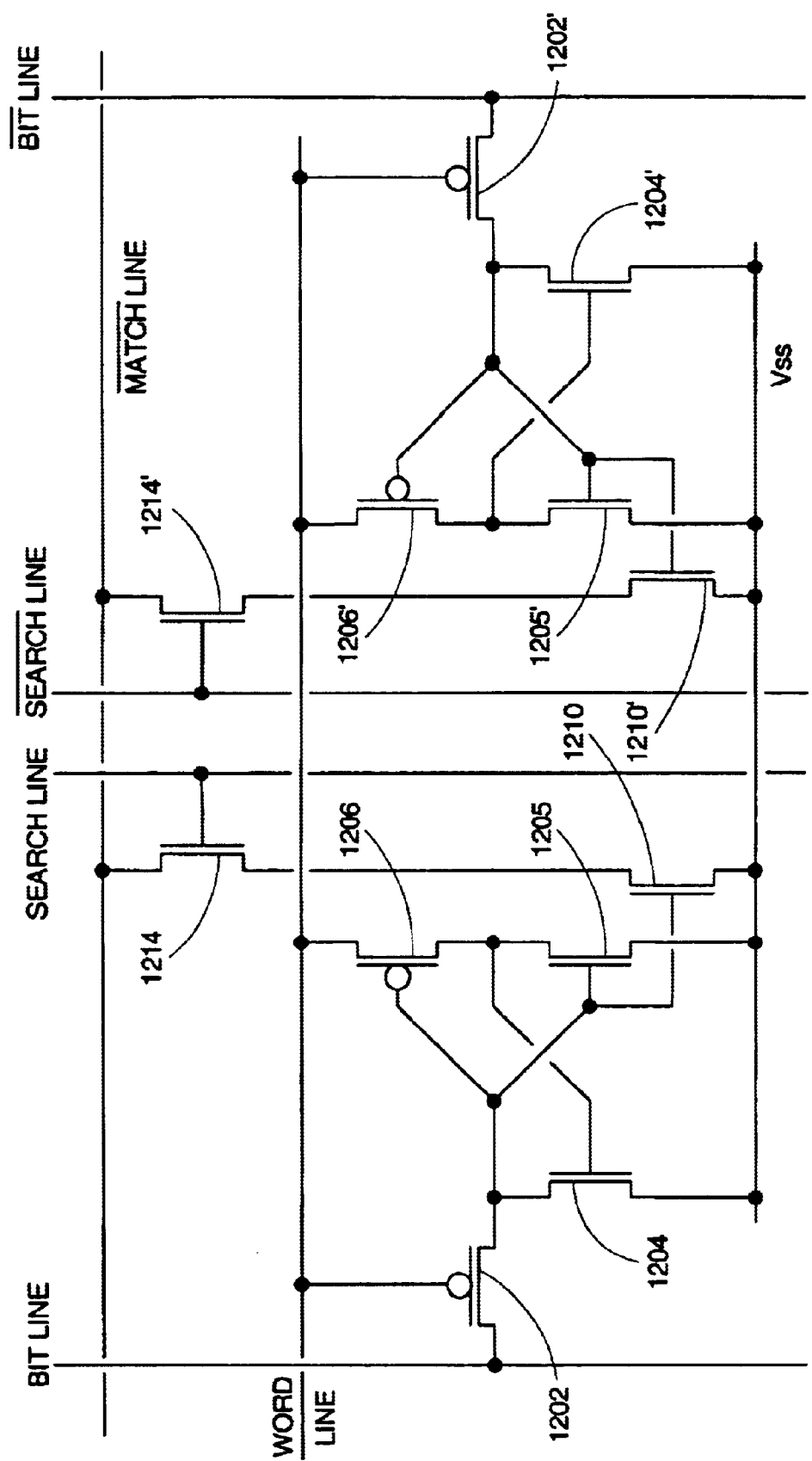
FIG. 12 is a schematic diagram of a full ternary cam cell using the cells of FIG. 10.

FIG. 12 shows a ternary CAM cell, which is a slight modification to the ternary CAM cell illustrated in FIG. 8. Transistors 1202, 1204, 1205 and 1206 correspond to T1, T5, T6 and T2 respectively. Similarly transistors 1202', 1204', 1205' and 1206' correspond to T1', T5', T6'and T2' respectively. The four transistor XOR gate consists of transistors 1210, 1214, 1210' and 1214', which correspond to transistors T4, T3, T4' and T3' respectively. The primary difference between the present embodiment and that illustrated in FIG. 8 is the connection of the gate of the compare transistor T4 and T4'. That is, the gate of the compare transistors T4 and T' is connected to the soft node rather than the hard node.

Figure 13:
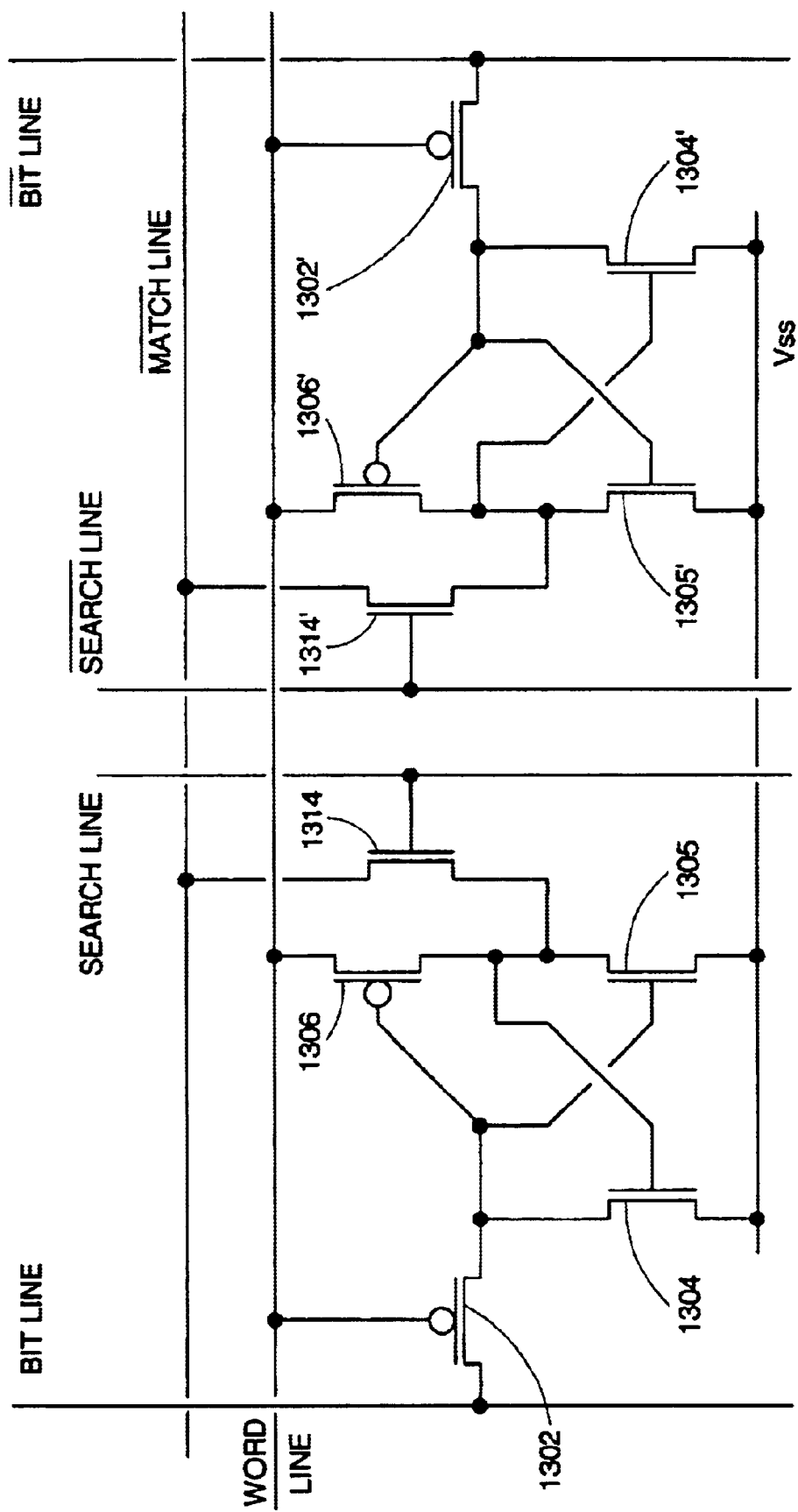
FIG. 13 is a schematic diagram of a simplified ternary cell of FIG. 12.

A further simplification of this cell is possible eliminating two of the transistors in the exclusive-NOR gate is shown in the circuit 1300 of FIG. 13. The gating function between the cell contents and the SEARCH and $\overline{\text{SEARCH}}$ line is now performed between the gate and source of the search transistors. The drawback with this arrangement is the requirement it places on the match sensing circuit. The high level of the match line can only fall to Vdd-Vt before the search transistors may conduct in the reverse direction if the cell is indicating a match. Thus some form of current sensing or other means to distinguish between levels of Vdd-Vt is needed.

Figure 14:
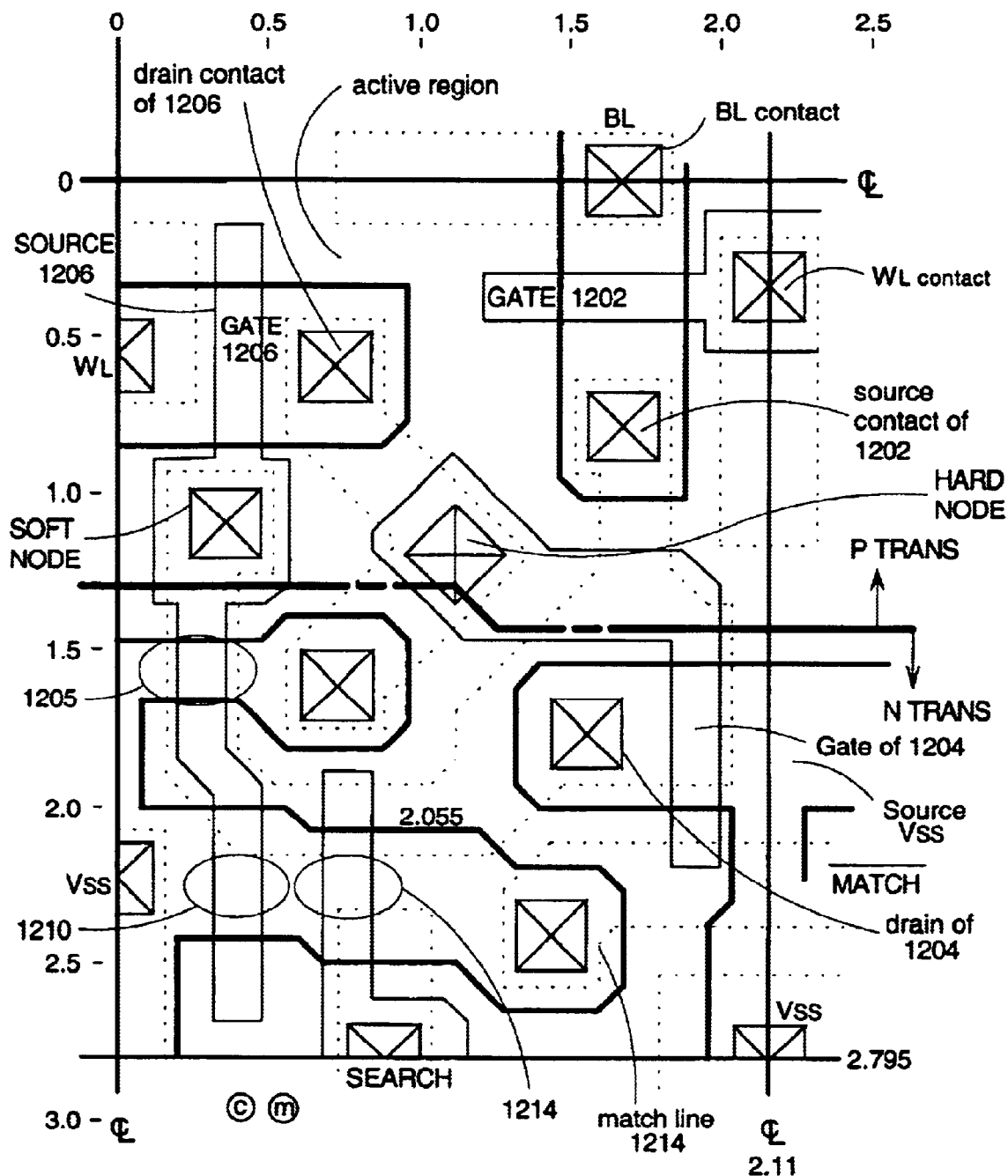
FIG. 14 is a schematic diagram of a layout of a layout of ½ the ternary CAM cell of FIG. 12.

Referring to FIG. 14, there is shown generally at numeral 1400 a layout in a typical 0.18 micron logic process for the circuit for a ternary CAM cell as shown in FIG. 12.

Referring to FIG. 14, there is shown a general layout of a ternary CAM cell, the circuit of which is shown in FIG. 12. Please note that they layout shown is for one half of the circuit as shown in FIG. 12. For convenience, the layout in FIG. 14 is labelled on the diagram. In the layout, the dashed lines enclose regions representing metal layers, the hatched lines represent regions corresponding to active regions and the continuous lines enclose regions of polysilicon. In particular, it has been noted that the soft node partially or substantially surrounds the hard node and therefore ensuring a tightly packed layout configuration. Furthermore, the hard and soft nodes consist of multiple contacts each composed of at least one metal layer.

Although the invention has been described with reference to certain specific embodiments, various modifications thereof will be apparent to those skilled in the art without departing from the spirit and scope of the invention as outlined in the claims appended hereto.

The embodiments of the invention in which an exclusive property or privilege is claimed are defined as follows:

1. A memory cell comprising:
   (a) CMOS inverting stage coupled between a supply line and a control line, said inverting stage having an soft node and an hard node;
   (b) an access transistor coupled between a bit line and said soft node for selectively coupling said bit line to said soft node in response to a control signal received along said control line; and
   (c) a feedback transistor coupled between said soft node and said supply line said feedback transistor being responsive to said hard node for latching said inverting stage in a first logic state, such that said cell is maintained in a second logic state by a leakage current flowing through said access transistor which is greater than a current flowing through said feedback transistor.

2. A memory as defined in claim 1, said control line being a word line.

3. A memory device as defined in claim 1, said feedback transistors being a PMOS devices and said access transistor being an NMOS device.

4. A memory cell comprising:
   (a) an inverter comprising first and second transistors of different polarities, serially coupled between a supply line and a word line respectively, said inverter having an soft node as a common gating signal for both said first and said second transistors and an hard node coupling said first and said second transistors;
   (b) third transistor having a same polarity as said first transistor, said third transistor coupled to said supply line, and cross coupled with said first transistor;
   a fourth transistor of opposite polarity to said third transistor, said fourth transistor coupling said soft node to a bit line and being responsive to said word line.

5. A memory cell according to claim 4 in which said fourth transistor arranged to have a greater drain to source leakage current in its off condition than exists at said soft node, thereby ensuring retention of a logic state on that node when said third transistor is not actively pulling said soft node to an opposite logic state.

6. A memory cell as defined in claim 4 in which a voltage level of said word line, in its inactive state, is controlled to ensure said access transistor provides sufficient charge to said soft node in order to maintain a logic level when said soft node is not actively pulled to said supply line.

7. A memory cell as defined in claim 4 in which said fourth transistor is fabricated so as to have a lower threshold voltage than said third transistor.

8. A memory cell as defined in claim 4 in which said fourth transistor is arranged to have a greater drain to source leakage current in its off condition than a drain to source leakage current of said third transistor in its off condition.

9. A memory cell as defined in claim 4 further comprising a comparison circuit coupled between said memory cell and a match line, said comparison circuit being responsive to a search line.

10. A memory cell as defined in claim 9 wherein said comparison circuit comprises a fifth transistor whose source is coupled to said hard node of said inverter, drain is coupled to said match line and gate is coupled to said search line.

11. A memory cell as defined in claim 9 wherein said comparison circuit comprises a fifth and a sixth transistor coupled in series between said match line and said word line, said fifth transistor's gate being coupled to said search line and said sixth transistor's gate being coupled to one of said soft node or said hard node of said inverter.

12. A memory cell as defined in claim 9 wherein said comparison circuit comprises a fifth and a sixth transistor coupled in series between said match line and said supply line, said fifth transistor's gate being coupled to said search line and said sixth transistors gate being coupled to one of said soft node or said hard node of said inverter.

13. A memory cell as defined in claim 9 wherein the comparison circuit comprises a fifth and a sixth transistor coupled in series between said match line and said supply line, said fifth transistor's gate being coupled to a first search line and said sixth transistors gate being coupled to said soft node of said inverter, and a seventh and an eighth transistor coupled in series between said match line and said supply line, said seventh transistor's gate being coupled to a second search line and said eighth transistor's gate being coupled to said hard node of said inverter.

14. A memory cell as defined in claim 9 further comprising a second memory cell and a second search line, each of said memory cells being coupled to a corresponding one of said search lines, both memory cells sharing a common word line, and said comparison circuit being coupled to each memory cell to form a ternary CAM cell.

* * * * *